(12) United States Patent
Ou et al.

(10) Patent No.: US 12,247,313 B2
(45) Date of Patent: Mar. 11, 2025

(54) CZOCHRALSKI SINGLE CRYSTAL FURNACE FOR PREPARING MONOCRYSTALLINE SILICON AND METHOD FOR PREPARING MONOCRYSTALLINE SILICON

(71) Applicants: ZHEJIANG JINKO SOLAR CO., LTD., Zhejiang (CN); JINKO SOLAR CO., LTD., Jiangxi (CN)

(72) Inventors: Ziyang Ou, Jiangxi (CN); Xiaolong Bai, Jiangxi (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 449 days.

(21) Appl. No.: 17/566,656

(22) Filed: Dec. 30, 2021

(65) Prior Publication Data
US 2022/0396898 A1  Dec. 15, 2022

(30) Foreign Application Priority Data
Jun. 11, 2021 (CN) .......................... 202110651170.6

(51) Int. Cl.
*C30B 15/14* (2006.01)
*C30B 15/20* (2006.01)
*C30B 29/06* (2006.01)

(52) U.S. Cl.
CPC .............. *C30B 15/14* (2013.01); *C30B 15/20* (2013.01); *C30B 29/06* (2013.01); *Y10T 117/1032* (2015.01)

(58) Field of Classification Search
CPC ..................................................... C30B 29/06
See application file for complete search history.

(56) References Cited

FOREIGN PATENT DOCUMENTS

| CN | 102181918 A | 9/2011 |
|----|-------------|--------|
| CN | 202323103 U | 7/2012 |
| CN | 104674341 A * | 6/2015 |

(Continued)

OTHER PUBLICATIONS

Zhejiang Jinko Solar Co., Ltd., et al., CN First Office Action with English Translation, CN 202110651170.6, Jul. 20, 2021, 15 pgs.

*Primary Examiner* — Hua Qi
(74) *Attorney, Agent, or Firm* — USCH Law, PC

(57) ABSTRACT

Disclosed are a Czochralski single crystal furnace for preparing monocrystalline silicon and a method for preparing monocrystalline silicon using the same. The Czochralski single crystal furnace is switchable between a first operation state and a second operation state. In response to the Czochralski single crystal furnace being switched between the first operation state and the second operation state, a first heat-preserving barrel moves relative to a second heat-preserving barrel. In response to the Czochralski single crystal furnace being in the first operation state, a side wall of the second heat-preserving barrel covers a first opening so as to isolate a reaction chamber from outside Czochralski single crystal furnace. In response to the Czochralski single crystal furnace being in the second operation state, the second heat-preserving barrel exposes the first opening, so that the reaction chamber is connected to the outside through the first opening.

9 Claims, 6 Drawing Sheets

(56) References Cited

FOREIGN PATENT DOCUMENTS

| | | | |
|---|---|---|---|
| CN | 205347626 U | 6/2016 | |
| CN | 106319619 A | 1/2017 | |
| CN | 206279284 U | 6/2017 | |
| CN | 206438197 U | 8/2017 | |
| CN | 110760929 A | 2/2020 | |
| CN | 110760935 A * | 2/2020 | ............ C30B 29/06 |
| CN | 210657215 U | 6/2020 | |
| CN | 210765579 U | 6/2020 | |

* cited by examiner

CZOCHRALSKI SINGLE CRYSTAL FURNACE FOR PREPARING MONOCRYSTALLINE SILICON AND METHOD FOR PREPARING MONOCRYSTALLINE SILICON

CROSS-REFERENCE TO RELATED APPLICATION

The present application claims priority to Chinese Patent Application No. 202110651170.6, filed on Jun. 11, 2021, which is incorporated herein by reference in its entirety.

TECHNICAL FIELD

Some embodiments of the present disclosure relate to the field of manufacturing monocrystalline silicon, in particular to a Czochralski single crystal furnace for preparing monocrystalline silicon and a method for preparing monocrystalline silicon.

BACKGROUND

With the continuous development of the world economy, the demand for efficient and clean energy in modernization is increasing. As a green energy and one of main energies for sustainable development of mankind, photovoltaic power generation has gained more and more attention from countries all over the world and has been vigorously developed. As one of the basic materials for photovoltaic power generation, monocrystalline silicon has a wide market demand.

At present, the monocrystalline silicon is grown by using a Czochralski method by using a Czochralski single crystal furnace. The Czochralski single crystal furnace is a device where polycrystalline materials such as polysilicon are melted by a heater in an inert gas (mainly helium) environment and a dislocation-free single crystal is grown by using the Czochralski method. However, a conventional Czochralski single crystal furnace may allow a reaction chamber to be connected to an outside of the Czochralski single crystal furnace by opening a cover of the Czochralski single crystal furnace, when a feeding operation or a heat dissipation operation is required, thus the operation process is complicated.

SUMMARY

Some embodiments of the present disclosure aim to provide a Czochralski single crystal furnace for preparing monocrystalline silicon and a method for preparing monocrystalline silicon, which can simplify an operation process of connecting a reaction chamber inside the Czochralski single crystal furnace with an outside of the Czochralski single crystal furnace.

As one aspect, some embodiments of the present disclosure provide a Czochralski single crystal furnace for a monocrystalline silicon preparation, including: a reaction chamber, and a first heat-preserving barrel and a second heat-preserving barrel respectively arranged around the reaction chamber. A side wall of the first heat-preserving barrel is provided with a first opening, an axial direction of the first heat-preserving barrel is the same as an axial direction of the second heat-preserving barrel, and one of the first heat-preserving barrel and the second heat-preserving barrel is arranged around the other of the first heat-preserving barrel and the second heat-preserving barrel; the Czochralski single crystal furnace has a first operation state and a second operation state, and the Czochralski single crystal furnace is configured to be switchable between the first operation state and the second operation state; wherein, in response to the Czochralski single crystal furnace being switched between the first operation state and the second operation state, the first heat-preserving barrel moves relative to the second heat-preserving barrel; in response to the Czochralski single crystal furnace being in the first operation state, a side wall of the second heat-preserving barrel is configured to cover the first opening so as to isolate the reaction chamber from an outside of the Czochralski single crystal furnace; and in response to the Czochralski single crystal furnace being in the second operation state, the second heat-preserving barrel is configured to expose the first opening, so that the reaction chamber is connected to the outside of the Czochralski single crystal furnace through the first opening.

As a second aspect, some embodiments of the present disclosure also provide a method for preparing monocrystalline silicon, including: performing a feeding stage; performing a silicon melting stage, wherein the side wall of the second heat-preserving barrel covers the first opening, so as to isolate the reaction chamber from the outside of the Czochralski single crystal furnace; performing a pulling stage; and performing a shutdown and cooling stage.

According to the Czochralski single crystal furnace for preparing the monocrystalline silicon and the method for preparing monocrystalline silicon, the Czochralski single crystal furnace is provided with the first heat-preserving barrel and the second heat-preserving barrel that are respectively arranged around the reaction chamber. The side wall of the first heat-preserving barrel is provided with the first opening. The axial direction of the first heat-preserving barrel is the same as the axial direction of the second heat-preserving barrel. One of the first heat-preserving barrel and the second heat-preserving barrel is arranged around the other of the first heat-preserving barrel and the second heat-preserving barrel. The Czochralski single crystal furnace has the first operation state and the second operation state, and the Czochralski single crystal furnace is switchable between the first operation state and the second operation state. Herein, in response to the Czochralski single crystal furnace being switched between the first operation state and the second operation state, the first heat-preserving barrel moves relative to the second heat-preserving barrel; in response to the Czochralski single crystal furnace being in the first operation state, the side wall of the second heat-preserving barrel covers the first opening so as to isolate the reaction chamber from the outside of the Czochralski single crystal furnace; and in response to the Czochralski single crystal furnace being in the second operation state, the second heat-preserving barrel exposes the first opening, so that the reaction chamber is connected to the outside of the Czochralski single crystal furnace through the first opening. Thus, when the reaction chamber in the Czochralski single crystal furnace requires to be connected to the outside of the Czochralski single crystal furnace, the first heat-preserving barrel is moved relative to the second heat-preserving barrel to enable the Czochralski single crystal furnace to be in the second operation state, so that the reaction chamber is connected to the outside of the Czochralski single crystal furnace through the first opening. When the reaction chamber in the Czochralski single crystal furnace requires to be isolated from the outside of the Czochralski single crystal furnace, the first heat-preserving barrel is moved relative to the second heat-preserving barrel to enable the Czochralski single crystal furnace to be in in the first operation state, so that the side wall of the second heat-preserving barrel covers the first opening. In this way, the reaction chamber inside the Czochralski single crystal furnace may be quickly connected or isolated from the outside of the Czochralski single crystal furnace, and the operation process of connecting the reaction chamber inside the Czochralski single crystal furnace with the outside of the Czochralski single crystal furnace can be simplified.

In some examples, the Czochralski single crystal furnace further includes a first drive assembly; the first drive assembly is configured to drive one of the first heat-preserving barrel and the second heat-preserving barrel to move relative to the other of the first heat-preserving barrel and the second heat-preserving barrel along the axial direction of the first heat-preserving barrel, so that the Czochralski single crystal furnace is switchable between the first operation state and the second operation state. In this way, when the Czochralski single crystal furnace requires to be switched between the first operation state and the second operation state, one of the first heat-preserving barrel and the second heat-preserving barrel is driven by the first drive assembly to move relative to the other along the axial direction of the first heat-preserving barrel, so that the side wall of the second heat-preserving barrel covers or exposes the first opening.

In some examples, the first heat-preserving barrel includes a first upper heat-preserving barrel, a first middle heat-preserving barrel and a first lower heat-preserving barrel that are sequentially arranged along the axial direction of the first heat-preserving barrel; the first middle heat-preserving barrel is connected with the first upper heat-preserving barrel and the first lower heat-preserving barrel respectively to form the first heat-preserving barrel together; and the first opening is disposed at a side wall of the first lower heat-preserving barrel. When the Czochralski single crystal furnace is in use, a crucible is placed in the reaction chamber. In this way, when the Czochralski single crystal furnace is used up and the crucible requires to be cooled, the Czochralski single crystal furnace may be in the second operation state, so that the reaction chamber may be connected to the outside of the Czochralski single crystal furnace through the first opening, thereby accelerating the cooling speed of the crucible.

In some examples, the second heat-preserving barrel includes a second upper heat-preserving barrel, a second middle heat-preserving barrel and a second lower heat-preserving barrel that are sequentially arranged along the axial direction of the second heat-preserving barrel; the second middle heat-preserving barrel is connected with the second upper heat-preserving barrel and the second lower heat-preserving barrel respectively to form the second heat-preserving barrel together; and a side wall of the second upper heat-preserving barrel is provided with a second opening, and the first heat-preserving barrel is capable to expose the second opening, so that the reaction chamber is connected to the outside of the Czochralski single crystal furnace through the second opening. In this way, when the Czochralski single crystal furnace is in use and requires to feed with raw material into the reaction chamber, the second opening may be exposed through the first heat-preserving barrel, so as to facilitate feeding into the reaction chamber through the second opening.

In some examples, the side wall of the second heat-preserving barrel is provided with a third opening; in response to the Czochralski single crystal furnace being in the second operation state, the third opening is aligned with the first opening, so that the reaction chamber is connected to the outside of the Czochralski single crystal furnace through both the first opening and the third opening.

In some examples, one of the side wall of the first heat-preserving barrel and the side wall of the second heat-preserving barrel is provided with a fourth opening; and one of the first heat-preserving barrel and the second heat-preserving barrel is capable to move relative to the other of the first heat-preserving barrel and the second heat-preserving barrel along the axial direction of the first heat-preserving barrel, until the reaction chamber is connected to the outside of the Czochralski single crystal furnace through the fourth opening.

In some examples, the first heat-preserving barrel includes a third upper heat-preserving barrel, a third middle heat-preserving barrel and a third lower heat-preserving barrel that are sequentially arranged along the axial direction of the first heat-preserving barrel; and the third middle heat-preserving barrel is respectively connected with the third upper heat-preserving barrel and the third lower heat-preserving barrel to form the first heat-preserving barrel together; the second heat-preserving barrel includes a fourth upper heat-preserving barrel, a fourth middle heat-preserving barrel and a fourth lower heat-preserving barrel that are sequentially arranged along the axial direction of the second heat-preserving barrel; and the fourth middle heat-preserving barrel is respectively connected with the fourth upper heat-preserving barrel and the fourth lower heat-preserving barrel to form the second heat-preserving barrel together; the second heat-preserving barrel is configured to surround the first heat-preserving barrel; the first opening is disposed at a side wall of the third upper heat-preserving barrel; the third opening is disposed at one of a side wall of the fourth upper heat-preserving barrel and a side wall of the fourth middle heat-preserving barrel; and the fourth opening is disposed at a side wall of the third lower heat-preserving barrel.

In some examples, the Czochralski single crystal furnace further includes a second drive assembly. The second drive assembly is configured to drive one of the first heat-preserving barrel and the second heat-preserving barrel to move relative to the other of the first heat-preserving barrel and the second heat-preserving barrel along the axial direction of the first heat-preserving barrel, so that the Czochralski single crystal furnace is switchable between the first operation state and the second operation state. In this way, when the Czochralski single crystal furnace requires to be switched between the first operation state and the second operation state, one of the first heat-preserving barrel and the second heat-preserving barrel is driven by the second drive assembly to move relative to the other along the axial direction of the first heat-preserving barrel, so that the side wall of the second heat-preserving barrel covers or exposes the first opening.

In some examples, the Czochralski single crystal furnace further includes a third drive assembly; the third drive assembly is configured to drive one of the first heat-preserving barrel and the second heat-preserving barrel to move relative to the other of the first heat-preserving barrel and the second heat-preserving barrel along a circumferential direction of the first heat-preserving barrel, so that the Czochralski single crystal furnace is switchable between the first operation state and the second operation state.

In some examples, the Czochralski single crystal furnace is in the first operation state in a case that the Czochralski single crystal furnace is in a silicon melting stage for preparing the monocrystalline silicon; and the Czochralski single crystal furnace is in the second operation state in a case that the Czochralski single crystal furnace is in any one of (i) a feeding stage for preparing the monocrystalline silicon and (ii) a shutdown and cooling stage of the single crystal growth.

In some examples, in the pulling stage, exposing the first opening by the side wall of the second heat-preserving barrel, and covering the second opening by the side wall of the first heat-preserving barrel, so that the reaction chamber is connected to the outside of the Czochralski single crystal furnace through the first opening, wherein an area of the first opening exposed by the second heat-preserving barrel ranges from one tenth to one half of an area of the first opening; in any one of (i) the feeding stage and (ii) the shutdown and cooling stage, exposing the first opening by the side wall of the second heat-preserving barrel, so that the reaction chamber is connected to the outside of the Czochralski single crystal furnace through the first opening, and exposing the second opening by the side wall of the first heat-preserving barrel, so that the reaction chamber is connected to the outside of the Czochralski single crystal furnace through the second opening.

In some examples, before the pulling stage, driving, by a first drive assembly, the second heat-preserving barrel to move along an axial direction of the first heat-preserving barrel, so that the area of the first opening exposed by the second heat-preserving barrel ranges from one tenth to one half of the area of the first opening; and before any one of (i) the feeding stage and (ii) the shutdown and cooling stage, driving, by the first drive assembly, the second heat-preserving barrel to move along the axial direction of the first heat-preserving barrel, so that the first heat-preserving barrel exposes the second opening and the second heat-preserving barrel exposes the first opening.

In some examples, in the pulling stage, exposing the fourth opening by the side wall of the second heat-preserving barrel, and covering the first opening by the side wall of the second heat-preserving barrel, so that the reaction chamber is connected to the outside of the Czochralski single crystal furnace through the fourth opening, wherein an area the fourth opening exposed by the second heat-preserving barrel ranges from one tenth to one half of an area of the fourth opening; and in any one of (i) the feeding stage and (ii) the shutdown and cooling stage, aligning the third opening with the first opening, so that the reaction chamber is connected to the outside of the Czochralski single crystal furnace through the first opening and the third opening; and exposing the fourth opening by the side wall of the second heat-preserving barrel, so that the reaction chamber is connected to the outside of the Czochralski single crystal furnace through the fourth opening.

In some examples, before the pulling stage, driving, by the second drive assembly, the second heat-preserving barrel to move along the axial direction of the first heat-preserving barrel, so that the area of the fourth opening exposed by the second heat-preserving barrel ranges from one tenth to one half of the area of the fourth opening; before any one of (i) the feeding stage and (ii) the shutdown and cooling stage, driving, by the second drive assembly, the second heat-preserving barrel to move along the axial direction of the first heat-preserving barrel, so that the second heat-preserving barrel exposes the fourth opening, and the first opening is aligned with the third opening.

DETAILED DESCRIPTION

Figure 1:
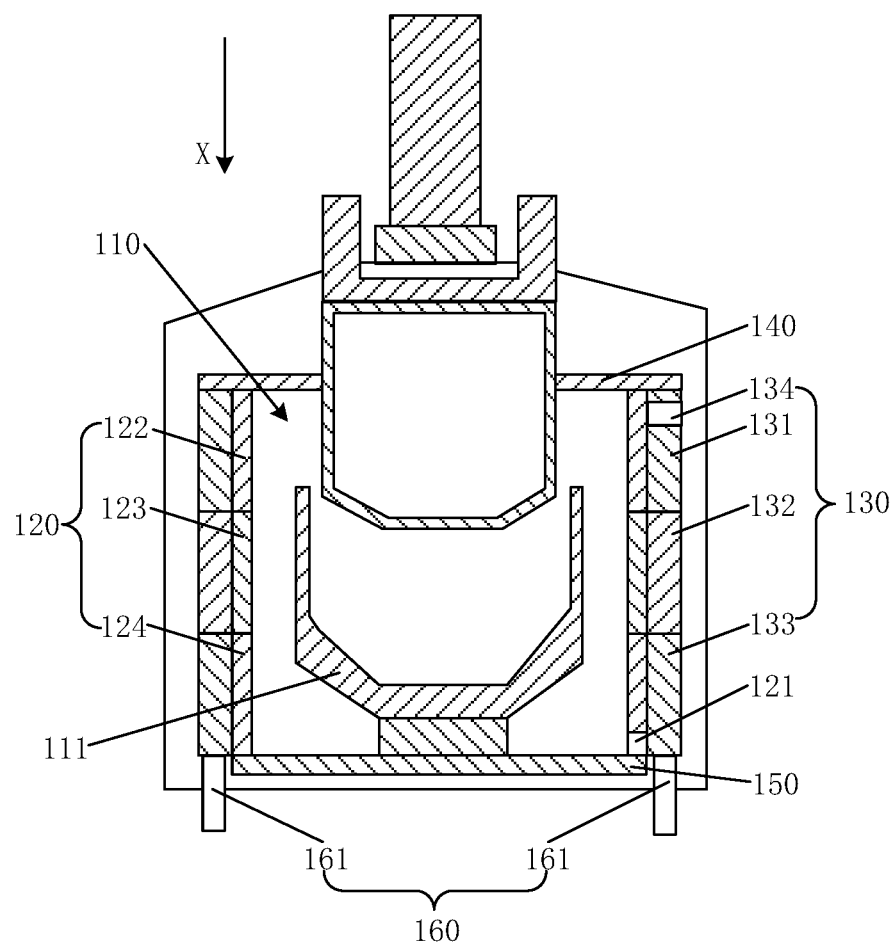
FIG. 1 is a sectional view of a Czochralski single crystal furnace for preparing monocrystalline silicon according to a first embodiment of the present disclosure.

Some embodiments of the present disclosure provide a Czochralski single crystal furnace (i.e., single crystal growth furnace) for preparing monocrystalline silicon. The Czochralski single crystal furnace is provided with a first heat-preserving barrel and a second heat-preserving barrel respectively arranged around a reaction chamber. A side wall of the first heat-preserving barrel is provided with a first opening. An axial direction of the first heat-preserving barrel is the same as an axial direction of the second heat-preserving barrel. One of the first heat-preserving barrel and the second heat-preserving barrel is arranged around the other. The Czochralski single crystal furnace has a first operation state and a second operation state, and the Czochralski single crystal furnace may be switched between the first operation state and the second operation state. Herein, in response to the Czochralski single crystal furnace being switched between the first operation state and the second operation state, the first heat-preserving barrel moves relative to the second heat-preserving barrel. In response to the Czochralski single crystal furnace being in the first operation state, a side wall of the second heat-preserving barrel covers the first opening so as to isolate the reaction chamber from outside of the Czochralski single crystal furnace. In response to the Czochralski single crystal furnace being in the second operation state, the second heat-preserving barrel exposes the first opening, so as to enable the reaction chamber to connected to the outside of the Czochralski single crystal furnace through the first opening. Thus, when the reaction chamber of the Czochralski single crystal furnace requires to connected to the outside of the Czochralski single crystal furnace, the first heat-preserving barrel is moved relative to the second heat-preserving barrel to enable the Czochralski single crystal furnace to be in the second operation state, so that the reaction chamber is connected to the outside of the Czochralski single crystal furnace through the first opening. When the reaction chamber inside the Czochralski single crystal furnace requires to isolate from the outside of the Czochralski single crystal furnace, the first heat-preserving barrel is moved relative to the second heat-preserving barrel to enable the Czochralski single crystal furnace to be in in the first operation state, so that the side wall of the second heat-preserving barrel covers the first opening. In this way, the reaction chamber inside the Czochralski single crystal furnace may be quickly connected or isolated from the outside of the Czochralski single crystal furnace. The Czochralski single crystal furnace may further includes a furnace shell, a crucible, a guide barrel and a heater and the like. An insulation quilt is disposed between the first/second heat-preserving barrel and the furnace shell. The insulation quilt may be made of thermal insulation material.

Embodiments of the present disclosure will be described in detail below with reference to the accompanying drawings in order to make the objectives, technical solutions and advantages of the present disclosure clearer. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

FIG. 1 shows a Czochralski single crystal furnace for preparing monocrystalline silicon according to a first embodiment of the present disclosure. The Czochralski single crystal furnace includes a reaction chamber 110; and a first heat-preserving barrel 120 and a second heat-preserving barrel 130 respectively arranged around the reaction chamber 110. A side wall of the first heat-preserving barrel 120 is provided with a first opening 121. An axial direction of the first heat-preserving barrel 120 is the same as an axial direction of the second heat-preserving barrel 130. One of the first heat-preserving barrel 120 and the second heat-preserving barrel 130 is arranged around the other of the first heat-preserving barrel 120 and the second heat-preserving barrel 130. The Czochralski single crystal furnace has a first operation state and a second operation state, and the Czochralski single crystal furnace may be switched between the first operation state and the second operation state. Herein, in response to the Czochralski single crystal furnace being switched between the first operation state and the second operation state, the first heat-preserving barrel 120 moves relative to the second heat-preserving barrel 130. In response to the Czochralski single crystal furnace being in the first operation state, a side wall of the second heat-preserving barrel 130 covers the first opening 121 so as to isolate the reaction chamber 110 from outside of the Czochralski single crystal furnace. In response to the Czochralski single crystal furnace being in the second operation state, the second heat-preserving barrel 130 exposes the first opening 121, so as to enable the reaction chamber 110 to connect to the outside of the Czochralski single crystal furnace through the first opening 121.

In an embodiment, the second heat-preserving barrel 130 is arranged around the first heat-preserving barrel 120 as an example for description. It should be noted that in other embodiments, the first heat-preserving barrel may be arranged around the second heat-preserving barrel, which is not limited in this embodiment.

In an embodiment, a crucible 111 is provided in the reaction chamber 110.

In an embodiment, a material of the first heat-preserving barrel 120 may be graphite. It should be noted that the material of the first heat-preserving barrel is not limited in this embodiment. For example, in some examples, the material of the first heat-preserving barrel may be a carbon-carbon composite material or a cured felt.

In an embodiment, the material of the second heat-preserving barrel 130 may be the cured felt. It should be noted that the material of the second heat-preserving barrel is not limited in this embodiment. For example, in some examples, the material of the second heat-preserving barrel may also be the carbon-carbon composite material or the graphite.

The above-mentioned Czochralski single crystal furnace may further include a top cover 140 and a bottom cover 150. The top cover 140 is located on the tops of the first heat-preserving barrel 120 and the second heat-preserving barrel 130, and is in contact with one of the first heat-preserving barrel 120 and the second heat-preserving barrel 130. The bottom cover 150 is located on the bottoms of the first heat-preserving barrel 120 and the second heat-preserving barrel 130, and is in contact with the other of the first heat-preserving barrel 120 and the second heat-preserving barrel 130. Herein, the tops of the first heat-preserving barrel 120 and the second heat-preserving barrel 130 and the bottoms of the first heat-preserving barrel 120 and the second heat-preserving barrel 130 are sequentially arranged along a direction of gravity (i.e., an X direction shown in FIG. 1).

This embodiment takes the top cover 140 being in contact with the second heat-preserving barrel 130 and the bottom cover 150 being in contact with the first heat-preserving barrel 120 as an example for description. In another embodiment, the top cover may be in contact with the first heat-preserving barrel, and in this case, the bottom cover is in contact with the second heat-preserving barrel.

In an embodiment, the materials of the top cover 140 and the bottom cover 150 may be graphite. It should be noted that the materials of the top cover and the bottom cover are not limited in this embodiment. For example, in some examples, the materials of the top cover and the bottom cover may be the carbon-carbon composite material or the cured felt, etc.

The Czochralski single crystal furnace may further include a first drive assembly 160. The first drive assembly 160 is configured to drive one of the first heat-preserving barrel 120 and the second heat-preserving barrel 130 to move relative to the other along the axial direction of the first heat-preserving barrel 120, so that the Czochralski single crystal furnace may be switched between the first operation state and the second operation state. In this way, when the Czochralski single crystal furnace requires to be switched between the first operation state and the second operation state, one of the first heat-preserving barrel 120 and the second heat-preserving barrel 130 is driven by the first drive assembly 160 to move relative to the other along the axial direction of the first heat-preserving barrel 120, so that the side wall of the second heat-preserving barrel 130 covers or exposes the first opening 121.

In an embodiment, the first drive assembly 160 may be four synchronously lifted cylinders 161. The four synchronously lifted cylinders 161 are connected with the bottom of the second heat-preserving barrel 130, and then the second heat-preserving barrel 130 is driven to move relative to the first heat-preserving barrel 120 in the axial direction of the first heat-preserving barrel 120 by a lifting or lowering of the four synchronously lifted cylinders 161, so that the Czochralski single crystal furnace is switched between the first operation state and the second operation state, and the side wall of the second heat-preserving barrel 130 covers or exposes the first opening 121.

It should be noted that in other embodiments, the number of synchronously lifted cylinders may not be four. In an embodiment, there may be six synchronously lifted cylinders. In another embodiment, there may be eight synchronously lifted cylinders. In addition, the synchronously lifted cylinder may not be connected with the bottom of the second heat-preserving barrel. In an embodiment, the synchronously lifted cylinder may be connected with the bottom of the first heat-preserving barrel, and then the first heat-preserving barrel is driven to move relative to the second heat-preserving barrel along the axial direction of the first heat-preserving barrel by the lifting or lowering of the synchronously lifted cylinder. Alternately, the first drive assembly may not be a synchronously lifted cylinder. In an embodiment, the first drive assembly may be a traction rope. The traction rope is fixed with an end of one of the first heat-preserving barrel and the second heat-preserving barrel, so that the end of the one of the first heat-preserving barrel and the second heat-preserving barrel is pulled by the traction rope to drive the first heat-preserving barrel to move relative to the second heat-preserving barrel along the axial direction of the first heat-preserving barrel.

Further, the first heat-preserving barrel 120 may include a first upper heat-preserving barrel 122, a first middle heat-preserving barrel 123 and a first lower heat-preserving barrel 124 which are sequentially arranged along the axial direction of the first heat-preserving barrel 120. The first middle heat-preserving barrel 123 is connected with the first upper heat-preserving barrel 122 and the first lower heat-preserving barrel 124 respectively to form the first heat-preserving barrel 120 together. The first upper heat-preserving barrel 122, the first middle heat-preserving barrel 123 and the first lower heat-preserving barrel 124 are sequentially arranged along a direction of gravity.

In an embodiment, the first opening 121 may be disposed at a side wall of the first lower heat-preserving barrel 124. The crucible 111 is located inside the reaction chamber 110 when the Czochralski single crystal furnace is in use. In this way, after the Czochralski single crystal furnace is used and the crucible 111 requires to be cooled, the Czochralski single crystal furnace may be in the second operation state, so that the reaction chamber 110 may be connected with the outside of the Czochralski single crystal furnace through the first opening 121, thereby accelerating the cooling speed of the crucible 111.

In an embodiment, there may be a plurality of first openings 121. In this way, when the second heat-preserving barrel 130 is moved relative to the axial direction of the first heat-preserving barrel 120, the second heat-preserving barrel 130 may expose a plurality of first openings 121, thereby further accelerating the cooling speed of the crucible 111. In an example, the plurality of first openings 121 may be distributed at equal intervals along a circumferential direction of the first heat-preserving barrel 120.

Figure 2:
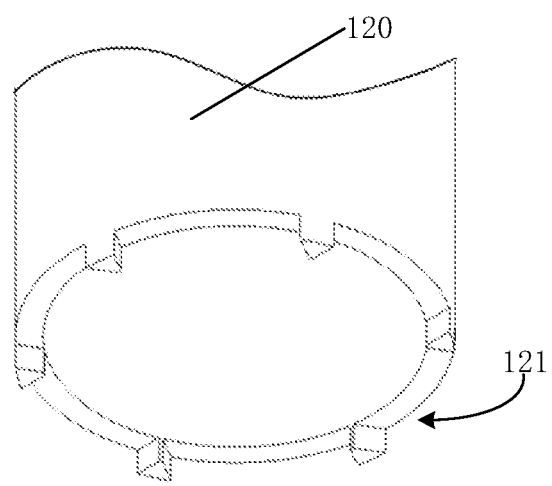
FIG. 2 is a partial structural schematic diagram of a first heat-preserving barrel according to the first embodiment of the present disclosure.

As shown in FIG. 2, in an embodiment, there may be six first openings 121. Further, the material between two adjacent first openings 121 of the first heat-preserving barrel 120 needs to just ensure that it may be used without deformation when the first heat-preserving barrel 120 is in contact with the bottom cover 150. In this way, an opening area of the first opening 121 may be increased without increasing the size of the first opening 121 in the axial direction of the first heat-preserving barrel 120, thereby further accelerating the cooling speed of the crucible 111.

With continued reference to FIG. 1, in this embodiment, when the Czochralski single crystal furnace is in a silicon melting stage for preparing the monocrystalline silicon, the Czochralski single crystal furnace is in the first operation state. In this case, the side wall of the second heat-preserving barrel 130 covers the first opening 121 so as to isolate the reaction chamber 110 from the outside of the Czochralski single crystal furnace. When the Czochralski single crystal furnace is in a shutdown and cooling stage for preparing the monocrystalline silicon, the Czochralski single crystal furnace is in the second operation state. In this case, the second heat-preserving barrel 130 exposes the first opening 121, so that the reaction chamber 110 is connected to the outside of the Czochralski single crystal furnace through the first opening 121.

In an embodiment, when the Czochralski single crystal furnace is in a pulling stage for preparing the monocrystalline silicon, the Czochralski single crystal furnace is in the first operation state. In this case, the second heat-preserving barrel 130 exposes the first opening 121, so that the reaction chamber 110 is connected to the outside of the Czochralski single crystal furnace through the first opening 121, and an area of the first opening 121 exposed by the second heat-preserving barrel 130 ranges from one tenth to one half of an area of the first opening 121.

The second heat-preserving barrel 130 may include a second upper heat-preserving barrel 131, a second middle heat-preserving barrel 132 and a second lower heat-preserving barrel 133 which are sequentially arranged along the axial direction of the second heat-preserving barrel 130. The second middle heat-preserving barrel 132 is connected with the second upper heat-preserving barrel 131 and the second lower heat-preserving barrel 133 respectively to form the second heat-preserving barrel 130. A side wall of the second upper heat-preserving barrel 131 is provided with a second opening 134, and the first heat-preserving barrel 120 may expose the second opening 134, so that the reaction chamber 110 is connected to the outside of the Czochralski single crystal furnace through the second opening 134.

In this way, when the Czochralski single crystal furnace is in use and requires to feed with raw material into the reaction chamber 110, the second opening 134 may be exposed through the first heat-preserving barrel 120, so as to facilitate feeding with raw material into the reaction chamber through the second opening 134.

In an embodiment, when the Czochralski single crystal furnace is in a pause stage for feeding with raw material for preparing the monocrystalline silicon, the Czochralski single crystal furnace is in the second operation state. In this case, the second heat-preserving barrel 130 exposes the first opening 121 so that the reaction chamber 110 is connected to the outside of the Czochralski single crystal furnace through the first opening 121, and the first heat-preserving barrel 120 exposes the second opening 134 so that the reaction chamber 110 is connected to the outside of the Czochralski single crystal furnace through the second opening 134 and may feed with raw material into the reaction chamber 110 through the second opening 134.

In an embodiment, a lower edge of the first opening 121 is connected (i.e., flushed) with a lower edge of the first heat-preserving barrel 120. A size of the first opening 121 in the axial direction of the first heat-preserving barrel 120 ranges from 150 mm to 200 mm (mm: millimeter), that is, the first opening 121 has a height ranges from 150 mm to 200 mm. The second opening 134 is a circular feeding port with a diameter ranging from 150 mm to 200 mm. A lifting or lowering stroke of the cylinder 161 of the first drive assembly 160 ranges from 180 mm to 200 mm.

In an embodiment, the size of the first opening 121 in the axial direction of the first heat-preserving barrel 120 may be 150 mm. The second opening 134 is a circular feeding port with a diameter of 150 mm. The lifting or lowering stroke of the cylinder 161 of the first drive assembly 160 is 180 mm.

A second embodiment of the present disclosure provides a method for preparing monocrystalline silicon, including: a feeding stage of a Czochralski single crystal furnace; a silicon melting stage, a pulling stage of the Czochralski single crystal furnace; and a shutdown and cooling stage of the Czochralski single crystal furnace. With continued reference to FIG. 1, in the silicon melting stage, the Czochralski single crystal furnace is in the first operation state, and the side wall of the second heat-preserving barrel 130 covers the first opening 121, thereby isolating the reaction chamber 110 from the outside of the Czochralski single crystal furnace and enhancing the heat preservation effect of the Czochralski single crystal furnace. The Czochralski single crystal furnace may be the Czochralski single crystal furnace provided in the first embodiment above.

In addition, it should be noted that in the silicon melting stage, the side wall of the first heat-preserving barrel 120 may cover the second opening 134, thereby further enhancing the heat preservation effect of the Czochralski single crystal furnace.

Figure 3:
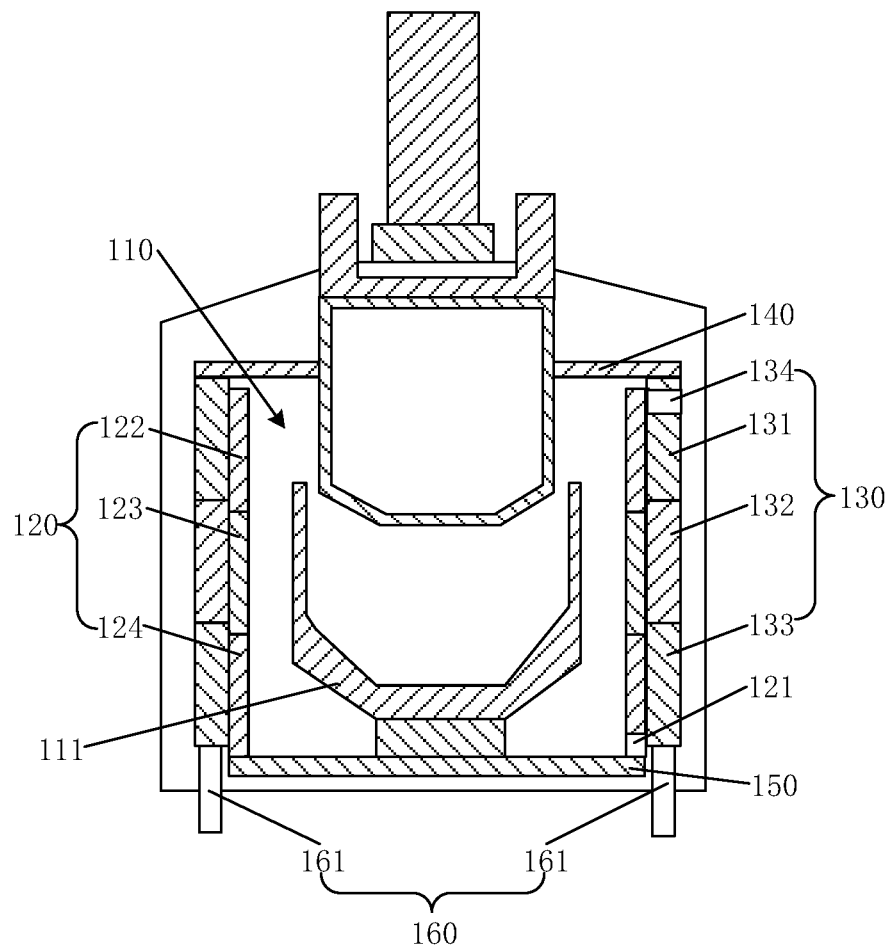
FIG. 3 is a sectional view of a Czochralski single crystal furnace in a pulling stage in a method for preparing monocrystalline silicon according to a second embodiment of the present disclosure.

Further, FIG. 3 shows the Czochralski single crystal furnace is in the pulling stage, and the Czochralski single crystal furnace is in the second operation state. The side wall of the second heat-preserving barrel 130 exposes the first opening 121, and the side wall of the first heat-preserving barrel 120 covers the second opening 134, so that the reaction chamber 110 may be connected to the outside of the Czochralski single crystal furnace through the first opening 121. Herein, an area of the first opening 121 exposed by the second heat-preserving barrel 130 ranges from one tenth to one half of an area of the first opening 121, thereby reducing an oxygen content in the Czochralski single crystal furnace and further reducing an oxygen content in the monocrystalline silicon.

Furthermore, before the pulling stage of the Czochralski single crystal furnace, the first drive assembly 160 drives the second heat-preserving barrel 130 to move along the axial direction of the first heat-preserving barrel 120, so that the area of the first opening 121 exposed by the second heat-preserving barrel 130 ranges from one tenth to one half of the area of the first opening 121.

In an embodiment, a lower edge of the first opening 121 may be connected (i.e., flushed) with a lower edge of the first heat-preserving barrel 120. A size of the first opening 121 in the axial direction of the first heat-preserving barrel 120 ranges from 150 mm to 200 mm. A lifting or lowering stroke of the cylinder 161 of the first drive assembly 160 ranges from 180 mm to 230 mm.

In an embodiment, the size of the first opening 121 in the axial direction of the first heat-preserving barrel 120 is 150 mm. Before the pulling stage of the Czochralski single crystal furnace, the cylinder 161 of the first drive assembly 160 is lifted to move the second heat-preserving barrel 130 by 20 mm in the axial direction of the first heat-preserving barrel 120, so that the area of the first opening 121 exposed by the second heat-preserving barrel 130 is two fifteenth of the area of the first open 121, and the Czochralski single crystal furnace is in the second operation state.

In an example, in the pulling stage of the Czochralski single crystal furnace, when the Czochralski single crystal furnace does not expose the first opening 121, the oxygen content in the silicon in the Czochralski single crystal furnace is 14.46 ppma (parts per million atoms). When the second heat-preserving barrel 130 moves 20 mm along the axial direction of the first heat-preserving barrel 120, so that the Czochralski single crystal furnace exposes the first opening 121, the oxygen content in the silicon in the Czochralski single crystal furnace is 12.24 ppma. In another example, when the Czochralski single crystal furnace does not expose the first opening 121, the oxygen content in the silicon in the Czochralski single crystal furnace is 15.46 ppma. When the second heat-preserving barrel 130 moves 20 mm along the axial direction of the first heat-preserving barrel 120, so that the Czochralski single crystal furnace exposes the first opening 121, the oxygen content in the silicon in the Czochralski single crystal furnace is 14.06 ppma. It can be seen that when the second heat-preserving barrel 130 moves 20 mm along the axial direction of the first heat-preserving barrel 120, so that the Czochralski single crystal furnace exposes the first opening 121, the oxygen content in the silicon in the Czochralski single crystal furnace is reduced by approximately 11.2% compared with the Czochralski single crystal furnace not exposing the first opening 121.

Figure 4:
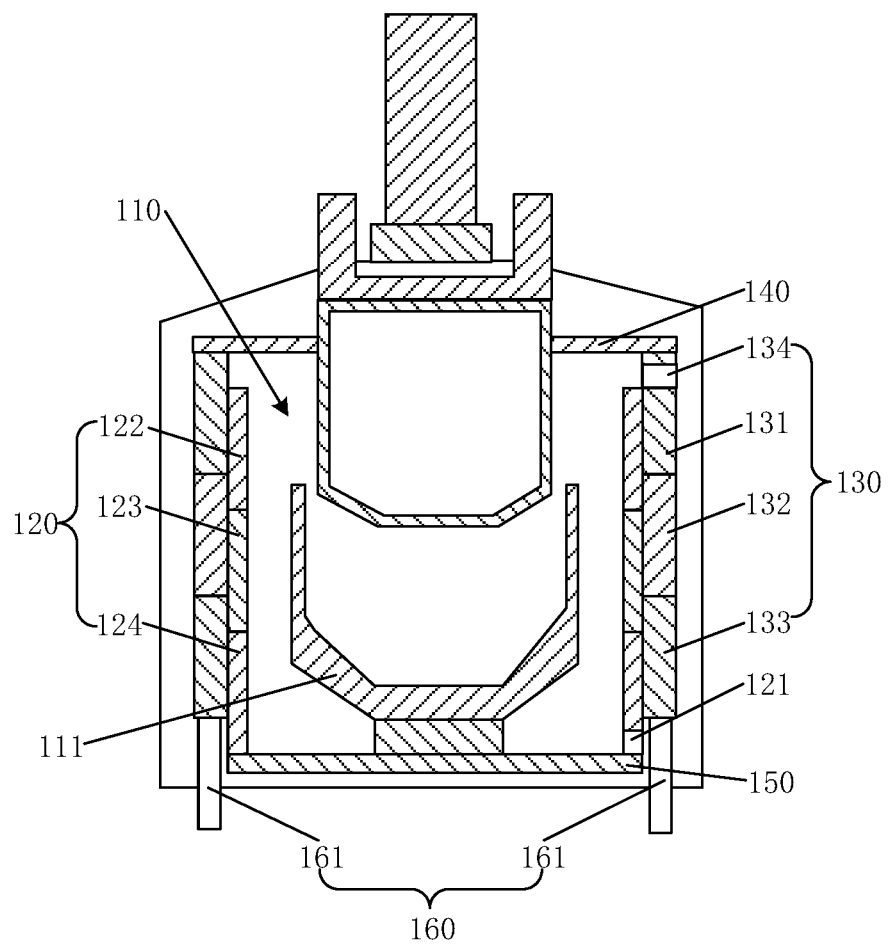
FIG. 4 is a sectional view of the Czochralski single crystal furnace in a feeding stage or a shutdown and cooling stage in the method for preparing monocrystalline silicon according to the second embodiment of the present disclosure.

Further, FIG. 4 shows the Czochralski single crystal furnace is in the feeding stage, or in the shutdown and cooling stage; and the Czochralski single crystal furnace is in the second operation state. The side wall of the second heat-preserving barrel 130 exposes the first opening 121 and the side wall of the first heat-preserving barrel 120 exposes the second opening 134, so that the reaction chamber 110 may be connected to the outside of the Czochralski single crystal furnace through both the first opening 121 and the second opening 134.

Further, before the feeding stage of the Czochralski single crystal furnace, or before the shutdown and cooling stage of the Czochralski single crystal furnace, the first drive assembly 160 drives the second heat-preserving barrel 130 to move along the axial direction of the first heat-preserving barrel 120, so that the first heat-preserving barrel 120 exposes the second opening 134 and the second heat-preserving barrel 130 exposes the first opening 121.

In the feeding stage of the Czochralski single crystal furnace, the reaction chamber 110 inside the Czochralski single crystal furnace may be fed with raw material through the second opening 134. In the shutdown and cooling stage of the Czochralski single crystal furnace, the reaction chamber 110 may be connected to the outside of the Czochralski single crystal furnace through the first opening 121 and the second opening 134, thereby further accelerating the cooling rate of the Czochralski single crystal furnace.

In an embodiment, the lower edge of the first opening 121 is connected (i.e., flushed) with the lower edge of the first heat-preserving barrel 120. The size of the first opening 121 in the axial direction of the first heat-preserving barrel 120 ranges from 150 mm to 200 mm. The second opening 134 is a circular feeding port with a diameter ranging from 150 mm to 200 mm. The lifting or lowering stroke of the cylinder 161 of the first drive assembly 160 ranges from 180 mm to 230 mm.

In an embodiment, the second opening 134 is a circular feeding port with a diameter of 150 mm. Before the feeding stage of the Czochralski single crystal furnace, or before the shutdown and cooling stage of the Czochralski single crystal furnace, the cylinder 161 of the first drive assembly 160 is lifted to move the second heat-preserving barrel 130 by 180 mm along the axial direction of the first heat-preserving barrel 120, so that the first heat-preserving barrel 120 exposes the second opening 134 and the second heat-preserving barrel 130 exposes the first opening 121.

Figure 5:
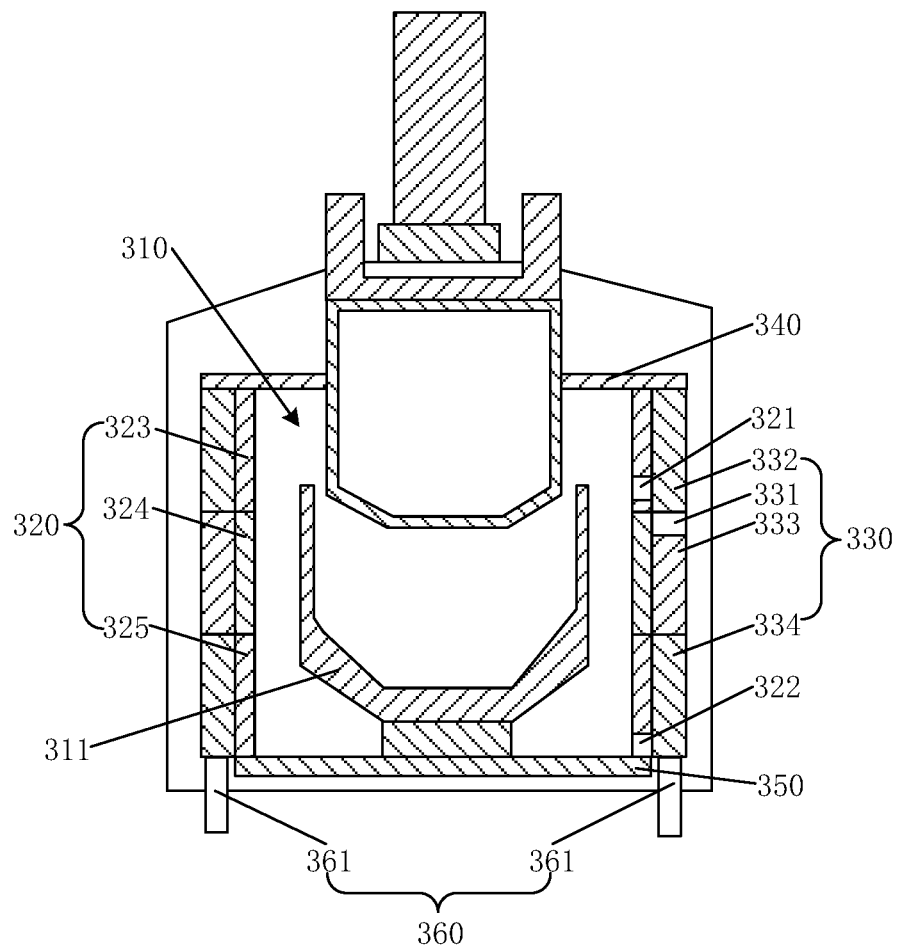
FIG. 5 is a sectional view of a Czochralski single crystal furnace for preparing monocrystalline silicon according to a third embodiment of the present disclosure.

FIG. 5 shows a Czochralski single crystal furnace for preparing monocrystalline silicon according to a third embodiment of the present disclosure. The Czochralski single crystal furnace includes a reaction chamber 310, and a first heat-preserving barrel 320 and a second heat-preserving barrel 330 respectively arranged around the reaction chamber 310. A side wall of the first heat-preserving barrel 320 is provided with a first opening 321. An axial direction of the first heat-preserving barrel 320 is the same as an axial direction of the second heat-preserving barrel 330. One of the first heat-preserving barrel 320 and the second heat-preserving barrel 330 is arranged around the other of the first heat-preserving barrel 320 and the second heat-preserving barrel 330. The Czochralski single crystal furnace has a first operation state and a second operation state. The Czochralski single crystal furnace may be switched between the first operation state and the second operation state. Herein, in response to the Czochralski single crystal furnace being switched between the first operation state and the second operation state, the first heat-preserving barrel 320 moves relative to the second heat-preserving barrel 330; in response to the Czochralski single crystal furnace being in the first operation state, a side wall of the second heat-preserving barrel 330 covers the first opening 321 so as to isolate the reaction chamber 310 from an outside of the Czochralski single crystal furnace; and in response to the Czochralski single crystal furnace being in the second operation state, the second heat-preserving barrel 330 exposes the first opening 321, so that the reaction chamber 310 is connected to the outside of the Czochralski single crystal furnace through the first opening 321.

In an embodiment, the second heat-preserving barrel 330 is arranged around the first heat-preserving barrel 320 as an example for description. It should be noted that in other embodiments, the first heat-preserving barrel may be arranged around the second heat-preserving barrel. In addition, reference may be made to the above-mentioned first embodiment for the materials of the first heat-preserving barrel 320 and the second heat-preserving barrel 330 in this embodiment, which will not be repeated here.

In addition, in an embodiment, a crucible 311 is provided in the reaction chamber 310.

In an embodiment, the Czochralski single crystal furnace provided may further include a top cover 340 and a bottom cover 350. For the functions and connections of the top cover 340 and the bottom cover 350, reference may be made to the above-mentioned first embodiment, which will not be repeated here.

In an embodiment, the top cover 340 is in contact with the second heat-preserving barrel 330, and the bottom cover 350 is in contact with the first heat-preserving barrel 320.

Further, in an embodiment, the side wall of the second heat-preserving barrel 330 is provided with a third opening 331. In response to the Czochralski single crystal furnace being in the second operation state, the third opening 331 is aligned with the first opening 321, so that the reaction chamber 310 is connected to the outside of the Czochralski single crystal furnace through the first opening 321 and the third opening 331.

Furthermore, in an embodiment, the Czochralski single crystal furnace further includes a second drive assembly 360. The first drive assembly 360 is configured to drive one of the first heat-preserving barrel 320 and the second heat-preserving barrel 330 to move relative to the other along the axial direction of the first heat-preserving barrel 320, so that the Czochralski single crystal furnace is switched between the first operation state and the second operation state.

In this way, when the Czochralski single crystal furnace requires to be switched between the first operation state and the second operation state, one of the first heat-preserving barrel 320 and the second heat-preserving barrel 330 is driven by the second drive assembly 360 to move relative to the other along the axial direction of the first heat-preserving barrel 320, so that the side wall of the second heat-preserving barrel 330 covers or exposes the first opening 121.

It should be noted that in other embodiments, the second drive assembly may not be provided. In an example, the Czochralski single crystal furnace may be provided with a third drive assembly (not shown in the figure). A distance between the first opening and the top cover is the same as a distance between the third opening and the top cover. The third drive assembly is configured to drive one of the first heat-preserving barrel and the second heat-preserving barrel to rotate relative to the other in a circumferential direction of the first heat-preserving barrel. In this way, the third opening may be aligned with the first opening, so that the reaction chamber may be connected to the outside of the Czochralski single crystal furnace through the first opening and the third opening.

In an embodiment, the second drive assembly 360 may be four synchronously lifted cylinders 361. The four synchronously lifted cylinders 361 are connected with the bottom of the second heat-preserving barrel 330, and then the second heat-preserving barrel 330 is driven to move relative to the first heat-preserving barrel 320 along the axial direction of the first heat-preserving barrel 320 by lifting or lowering of the four synchronously lifted cylinders 361, so that the Czochralski single crystal furnace is switched between the first operation state and the second operation state, and the side wall of the second heat-preserving barrel 330 covers or exposes the first opening 321.

It should be noted that in other embodiments, the number of synchronously lifted cylinders may not be four. In an embodiment, there may be six synchronously lifted cylinders. In an embodiment, there may be eight synchronously lifted cylinders. In addition, the synchronously lifted cylinder may not be connected with the bottom of the second heat-preserving barrel. In an embodiment, the synchronously lifted cylinder is connected with the bottom of the first heat-preserving barrel, and then the first heat-preserving barrel is driven to move relative to the second heat-preserving barrel along the axial direction of the first heat-preserving barrel by the lifting or lowering of the synchronously lifted cylinder. In addition, the second drive assembly may not be synchronously lifted cylinders. In an embodiment, the second drive assembly may be a traction rope. The traction rope is fixed with an end of one of the first heat-preserving barrel and the second heat-preserving barrel, so that the end of the one of the first heat-preserving barrel and the second heat-preserving barrel is pulled by the traction rope to drive the first heat-preserving barrel to move relative to the second heat-preserving barrel along the axial direction of the first heat-preserving barrel.

In an embodiment, the side wall of the first heat-preserving barrel 320 or the side wall of the second heat-preserving barrel 330 is provided with a fourth opening 322. One of the first heat-preserving barrel 320 and the second heat-preserving barrel 330 may move relative to the other along the axial direction of the first heat-preserving barrel 320, so that the reaction chamber 310 is connected to the outside of the Czochralski single crystal furnace through the fourth opening 322.

Further, the first heat-preserving barrel 320 includes a third upper heat-preserving barrel 323, a third middle heat-preserving barrel 324 and a third lower heat-preserving barrel 325 which are sequentially arranged along the axial direction of the first heat-preserving barrel 320. The third middle heat-preserving barrel 324 is connected with the third upper heat-preserving barrel 323 and the third lower heat-preserving barrel 325 respectively to form the first heat-preserving barrel 320 together. The second heat-preserving barrel 330 includes a fourth upper heat-preserving barrel 332, a fourth middle heat-preserving barrel 333 and a fourth lower heat-preserving barrel 334 which are sequentially arranged along the axial direction of the second heat-preserving barrel 330. The fourth middle heat-preserving barrel 333 is connected with the fourth upper heat-preserving barrel 332 and the fourth lower heat-preserving barrel 334 respectively to form the second heat-preserving barrel 330 together. The first opening 321 is disposed at a side wall of the third upper heat-preserving barrel 323. The third opening 331 is disposed at a side wall of the fourth upper heat-preserving barrel 332 or a side wall of the fourth middle heat-preserving barrel 333. The fourth opening 322 is disposed at a side wall of the third lower heat-preserving barrel 325.

In an embodiment, the first opening 321 is disposed at the side wall of the third upper heat-preserving barrel 323, the third opening 331 is disposed at the side wall of the fourth middle heat-preserving barrel 333, and the fourth opening 322 is disposed at the side wall of the third lower heat-preserving barrel 325. In an embodiment, the first opening is disposed at the side wall of the third upper heat-preserving barrel, the third opening is disposed at the side wall of the fourth upper heat-preserving barrel, and the fourth opening is disposed at the side wall of the third lower heat-preserving barrel.

In yet another embodiment, the first opening is disposed at the side wall of the third upper heat-preserving barrel or a side wall of the third middle heat-preserving barrel. The third opening is disposed at the side wall of the fourth upper heat-preserving barrel. The fourth opening is disposed at a side wall of the fourth lower heat-preserving barrel. In this case, the drive assembly is configured to drive the first heat-preserving barrel to move along the axial direction of the first heat-preserving barrel, so that the first opening is aligned with the third opening and the first heat-preserving barrel exposes the fourth opening.

Further, in an embodiment, when the Czochralski single crystal furnace is in a silicon melting stage of the monocrystalline silicon preparation, the Czochralski single crystal furnace is in the first operation state. In this case, the side wall of the second heat-preserving barrel 330 covers the first opening 321. In addition, the side wall of the second heat-preserving barrel 330 may cover the fourth opening 322 so as to isolate the reaction chamber 310 from the outside of the Czochralski single crystal furnace. When the Czochralski single crystal furnace is in a pause and feeding stage or a shutdown and cooling stage for preparing the monocrystalline silicon, the Czochralski single crystal furnace is in the second operation state. Herein, when the Czochralski single crystal furnace is in the pause and feeding stage, the temperature in the furnace holds at a high temperature, e.g., greater than 500°. In this case, the second heat-preserving barrel 330 exposes the first opening 321, that is, the third opening 331 is aligned with the first opening 321, so that the reaction chamber 310 is connected to the outside of the Czochralski single crystal furnace through the first opening 321. The second heat-preserving barrel 330 exposes the fourth opening 322, so as to facilitate feeding with raw material into the reaction chamber 310 through both the third opening 331 and the first opening 321. Further, the reaction chamber 310 is connected to the outside of the Czochralski single crystal furnace through the fourth opening 322, thereby further accelerating the cooling rate of the Czochralski single crystal furnace.

Further, in an embodiment, when the Czochralski single crystal furnace is in a pulling stage for preparing the monocrystalline silicon, the Czochralski single crystal furnace is in the first operation state. In this case, the side wall of the second heat-preserving barrel 330 exposes the fourth opening 322, and the side wall of the second heat-preserving barrel 330 covers the first opening 321, so that the reaction chamber may be connected to the outside of the Czochralski single crystal furnace through the fourth opening 322. An area of the fourth opening 322 exposed by the second heat-preserving barrel 330 ranges from one tenth to one half of an area of the fourth opening 322.

In an embodiment, the first opening 321 and the third opening 331 are circular feeding ports with a diameter ranging from 150 mm to 200 mm. A lower edge of the fourth opening 322 is connected (i.e., flushed) with a lower edge of the first heat-preserving barrel 320. A size of the fourth opening 322 in the axial direction of the first heat-preserving barrel 320 ranges from 150 mm to 200 mm. A lifting or lowering stroke of the cylinder 361 of the second drive assembly 360 ranges from 180 mm 230 mm.

In an embodiment, the first opening 321 and the third opening 331 are circular feeding ports with a diameter of 150 mm. The size of the fourth opening 322 in the axial direction of the first heat-preserving barrel 320 is 150 mm. The lifting or lowering stroke of the cylinder 361 of the second drive assembly 360 is 180 mm.

A fourth embodiment of the present disclosure provides a method for preparing monocrystalline silicon, including: a feeding stage of a Czochralski single crystal furnace; a silicon melting stage, a pulling stage of the Czochralski single crystal furnace, and a shutdown and cooling stage of the Czochralski single crystal furnace. With continued reference to FIG. 5, in the silicon melting stage, the Czochralski single crystal furnace is in the first operation state, and the side wall of the second heat-preserving barrel 330 covers the first opening 321, thereby isolating the reaction chamber 310 from the outside of the Czochralski single crystal furnace. The Czochralski single crystal furnace may be the Czochralski single crystal furnace provided in the third embodiment above.

In addition, it should be noted that in the silicon melting stage, the side wall of the second heat-preserving barrel 330 may also cover the fourth opening 322, thereby further enhancing the heat preservation effect of the Czochralski single crystal furnace.

Figure 6:
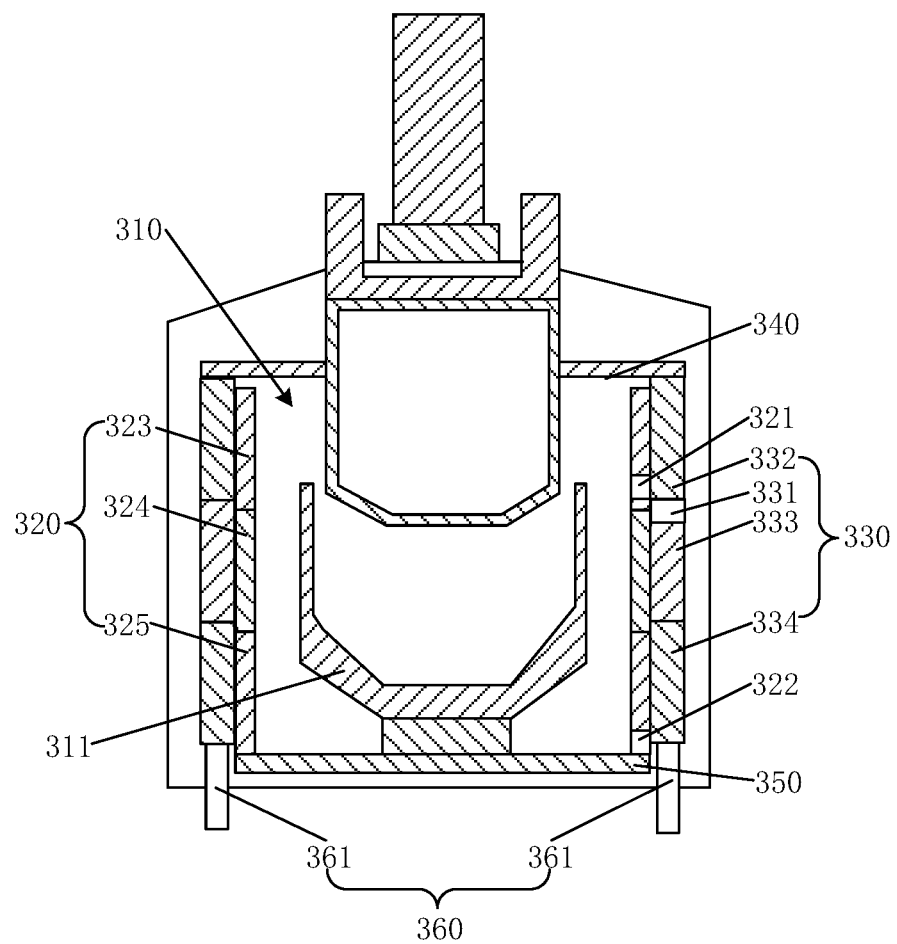
FIG. 6 is a sectional view of a Czochralski single crystal furnace in a pulling stage in a method for preparing monocrystalline silicon according to a fourth embodiment of the present disclosure.

Further, FIG. 6 shows the Czochralski single crystal furnace is in the pulling stage, and the Czochralski single crystal furnace is in the first operation state. The side wall of the second heat-preserving barrel 330 exposes the fourth opening 322, and the side wall of the second heat-preserving barrel 330 covers the first opening 321, so that the reaction chamber may be connected to the outside of the Czochralski single crystal furnace through the fourth opening 322. An area of the fourth opening 322 exposed by the second heat-preserving barrel 330 ranges from one tenth to one half of an area of the fourth opening 322.

Furthermore, before the pulling stage of the Czochralski single crystal furnace, the second drive assembly 360 drives the second heat-preserving barrel 330 to move along the axial direction of the first heat-preserving barrel 320, so that the area of the fourth opening 322 exposed by the second heat-preserving barrel 330 ranges from one tenth to one half of the area of the fourth opening 322.

In an embodiment, a lower edge of the fourth opening 322 is connected (i.e., flushed) with a lower edge of the first heat-preserving barrel 320. A size of the fourth opening 322 in the axial direction of the first heat-preserving barrel 320 ranges from 150 mm to 200 mm. A lifting or lowering stroke of the cylinder 361 of the second drive assembly 360 ranges from 180 mm 230 mm.

In an embodiment, the lower edge of the fourth opening 322 is connected (i.e., flushed) with the lower edge of the first heat-preserving barrel 320. The size of the fourth opening 322 in the axial direction of the first heat-preserving barrel 320 is 150 mm. Before the pulling stage of the Czochralski single crystal furnace, the cylinder 361 of the second drive assembly 360 is lifted to move the second heat-preserving barrel 330 by 20 mm in the axial direction of the first heat-preserving barrel 320, so that the area of the fourth opening 322 exposed by the second heat-preserving barrel 330 is two fifteenths of the area of the fourth opening 322.

In an example, in the pulling stage of the Czochralski single crystal furnace, when the Czochralski single crystal furnace does not expose the fourth opening 322, the oxygen content in the silicon in the Czochralski single crystal furnace is 14.46 ppma. When the second heat-preserving barrel 330 moves 20 mm along the axial direction of the first heat-preserving barrel 320, so that the Czochralski single crystal furnace exposes the fourth opening 322, the oxygen content in the silicon in the Czochralski single crystal furnace is 12.24 ppma. In another example, when the Czochralski single crystal furnace does not expose the fourth opening 322, the oxygen content in the silicon in the Czochralski single crystal furnace is 15.46 ppma. When the second heat-preserving barrel 330 moves 20 mm along the axial direction of the first heat-preserving barrel 320, so that the Czochralski single crystal furnace exposes the fourth opening 322, the oxygen content in the silicon in the Czochralski single crystal furnace is 14.06 ppma. It can be seen that when the second heat-preserving barrel 330 moves 20 mm along the axial direction of the first heat-preserving barrel 320, so as to expose the fourth opening 322 of the Czochralski single crystal furnace, the oxygen content in the silicon in the Czochralski single crystal furnace is reduced by approximately 11.2% compared with the Czochralski single crystal furnace not exposing the fourth opening 322.

Figure 7:
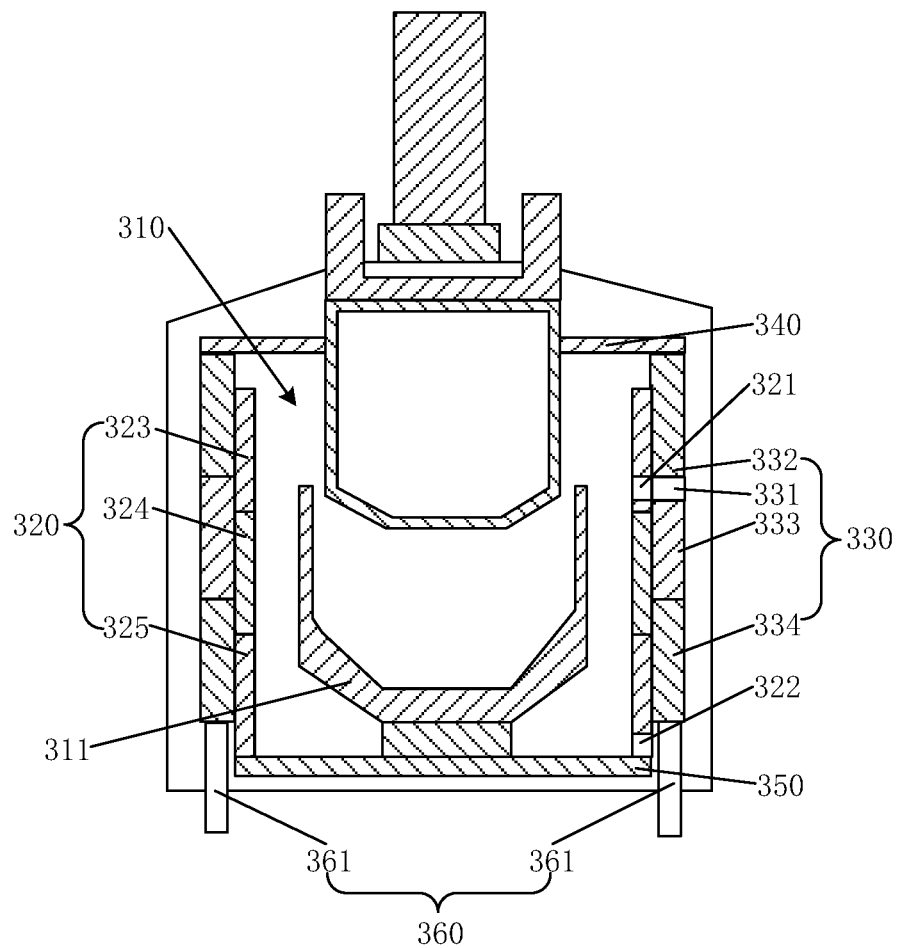
FIG. 7 is a sectional view of the Czochralski single crystal furnace in a feeding stage or a shutdown and cooling stage in the method for preparing monocrystalline silicon according to the fourth embodiment of the present disclosure.

FIG. 7 shows the feeding stage of the Czochralski single crystal furnace, or in the shutdown and cooling stage of the Czochralski single crystal furnace, and the Czochralski single crystal furnace is in the second operation state. The third opening 331 is aligned with the first opening 321, and the side wall of the second heat-preserving barrel 330 exposes the fourth opening 322, so that the reaction chamber 310 may be connected to the outside of the Czochralski single crystal furnace through the first opening 321 and the third opening 331, and the reaction chamber 310 may be further connected to the outside of the Czochralski single crystal furnace through the fourth opening 322.

Further, before the feeding stage of the Czochralski single crystal furnace, or before the shutdown and cooling stage of the Czochralski single crystal furnace, the second drive assembly 360 drives the second heat-preserving barrel 330 to move along the axial direction of the first heat-preserving barrel 320, so that the second heat-preserving barrel 330 exposes the fourth opening 322 and the first opening 321 is aligned with the third opening 331.

In the feeding stage of the Czochralski single crystal furnace, the reaction chamber 310 inside the Czochralski single crystal furnace may be fed with raw material through the first opening 321 and the third opening 331. In the shutdown and cooling stage of the Czochralski single crystal furnace, the reaction chamber 310 may be connected to the outside of the Czochralski single crystal furnace through the first opening 321 and the third opening 331, and the reaction chamber 310 may also be connected to the outside of the Czochralski single crystal furnace through the fourth opening 322, thereby further accelerating the cooling rate of the Czochralski single crystal furnace.

In an embodiment, the first opening 321 and the third opening 331 are circular feeding ports with a diameter ranging from 150 mm to 200 mm. The lower edge of the fourth opening 322 is connected (i.e., flushed) with the lower edge of the first heat-preserving barrel 320. The size of the fourth opening 322 in the axial direction of the first heat-preserving barrel 320 ranges from 150 mm to 200 mm. The lifting or lowering stroke of the cylinder 361 of the second drive assembly 360 ranges from 180 mm to 230 mm.

In an embodiment, the first opening 321 and the third opening 331 are circular feeding ports with a diameter of 150 mm. Before the feeding stage of the Czochralski single crystal furnace, or before the Czochralski single crystal furnace shutdown and cooling stage of the Czochralski single crystal furnace, the cylinder 361 of the second drive assembly 360 is lifted to move the second heat-preserving barrel 330 by 180 mm along the axial direction of the first heat-preserving barrel 320, so that the second heat-preserving barrel 330 exposes the fourth opening 322, and the first opening 321 is aligned with the third opening 331.

Those skilled in the art shall appreciate that the aforementioned embodiments are specific embodiments for implementing the present disclosure. In practice, however, various changes may be made in the forms and details of the specific embodiments without departing from the scope of the present disclosure. Any person skilled in the art may make their own changes and modifications without departing from the scope of the present disclosure, so the protection scope of the present disclosure shall be subject to the scope defined by the claims.

What is claimed is:

1. A Czochralski single crystal furnace for preparing monocrystalline silicon, comprising:
   a reaction chamber, and
   a first heat-preserving barrel and a second heat-preserving barrel respectively arranged around the reaction chamber, wherein:
   a side wall of the first heat-preserving barrel is provided with a first opening, an axial direction of the first heat-preserving barrel is the same as an axial direction of the second heat-preserving barrel, and one of the first heat-preserving barrel and the second heat-preserving barrel is arranged around the other of the first heat-preserving barrel and the second heat-preserving barrel;
   the Czochralski single crystal furnace has a first operation state and a second operation state, and the Czochralski single crystal furnace is configured to be switchable between the first operation state and the second operation state; wherein, in response to the Czochralski single crystal furnace being switched between the first operation state and the second operation state, the first heat-preserving barrel moves relative to the second heat-preserving barrel along the axial direction of the first heat-preserving barrel;
   in response to the Czochralski single crystal furnace being in the first operation state, a side wall of the second heat-preserving barrel is configured to cover the first opening so as to isolate the reaction chamber from an outside of the Czochralski single crystal furnace; and in response to the Czochralski single crystal furnace being in the second operation state, the second heat-preserving barrel is configured to expose the first opening, so that the reaction chamber is connected to the outside of the Czochralski single crystal furnace through the first opening.

2. The Czochralski single crystal furnace according to claim 1, further comprising a first drive assembly; wherein,
the first drive assembly is configured to drive one of the first heat-preserving barrel and the second heat-preserving barrel to move relative to the other of the first heat-preserving barrel and the second heat-preserving barrel along the axial direction of the first heat-preserving barrel, so that the Czochralski single crystal furnace is switchable between the first operation state and the second operation state.

3. The Czochralski single crystal furnace according to claim 2, wherein:
the first heat-preserving barrel includes a first upper heat-preserving barrel, a first middle heat-preserving barrel and a first lower heat-preserving barrel that are sequentially arranged along the axial direction of the first heat-preserving barrel; the first middle heat-preserving barrel is connected with the first upper heat-preserving barrel and the first lower heat-preserving barrel respectively to form the first heat-preserving barrel together; and
the first opening is disposed at a side wall of the first lower heat-preserving barrel.

4. The Czochralski single crystal furnace according to claim 3, wherein:
the second heat-preserving barrel includes a second upper heat-preserving barrel, a second middle heat-preserving barrel and a second lower heat-preserving barrel that are sequentially arranged along the axial direction of the second heat-preserving barrel; the second middle heat-preserving barrel is connected with the second upper heat-preserving barrel and the second lower heat-preserving barrel respectively to form the second heat-preserving barrel together; and
a side wall of the second upper heat-preserving barrel is provided with a second opening, and the first heat-preserving barrel is capable to expose the second opening, so that the reaction chamber is connected to the outside of the Czochralski single crystal furnace through the second opening.

5. The Czochralski single crystal furnace according to claim 1, wherein the side wall of the second heat-preserving barrel is provided with a third opening;
in response to the Czochralski single crystal furnace being in the second operation state, the third opening is aligned with the first opening, so that the reaction chamber is connected to the outside of the Czochralski single crystal furnace through both the first opening and the third opening.

6. The Czochralski single crystal furnace according to claim 5, wherein one of the side wall of the first heat-preserving barrel and the side wall of the second heat-preserving barrel is provided with a fourth opening; and one of the first heat-preserving barrel and the second heat-preserving barrel is capable to move relative to the other of the first heat-preserving barrel and the second heat-preserving barrel along the axial direction of the first heat-preserving barrel, until the reaction chamber is connected to the outside of the Czochralski single crystal furnace through the fourth opening.

7. The Czochralski single crystal furnace according to claim 6, wherein:
the first heat-preserving barrel includes a third upper heat-preserving barrel, a third middle heat-preserving barrel and a third lower heat-preserving barrel that are sequentially arranged along the axial direction of the first heat-preserving barrel; and the third middle heat-preserving barrel is respectively connected with the third upper heat-preserving barrel and the third lower heat-preserving barrel to form the first heat-preserving barrel together;
the second heat-preserving barrel includes a fourth upper heat-preserving barrel, a fourth middle heat-preserving barrel and a fourth lower heat-preserving barrel that are sequentially arranged along the axial direction of the second heat-preserving barrel; and the fourth middle heat-preserving barrel is respectively connected with the fourth upper heat-preserving barrel and the fourth lower heat-preserving barrel to form the second heat-preserving barrel together;
the second heat-preserving barrel is configured to surround the first heat-preserving barrel;
the first opening is disposed at a side wall of the third upper heat-preserving barrel;
the third opening is disposed at one of a side wall of the fourth upper heat-preserving barrel and a side wall of the fourth middle heat-preserving barrel; and
the fourth opening is disposed at a side wall of the third lower heat-preserving barrel.

8. The Czochralski single crystal furnace according to claim 7, further comprising: a second drive assembly; wherein:
the second drive assembly is configured to drive one of the first heat-preserving barrel and the second heat-preserving barrel to move relative to the other of the first heat-preserving barrel and the second heat-preserving barrel along the axial direction of the first heat-preserving barrel, so that the Czochralski single crystal furnace is switchable between the first operation state and the second operation state.

9. The Czochralski single crystal furnace according to claim 1, wherein:
the Czochralski single crystal furnace is in the first operation state in a case that the Czochralski single crystal furnace is in a silicon melting stage for preparing the monocrystalline silicon; and
the Czochralski single crystal furnace is in the second operation state in a case that the Czochralski single crystal furnace is in any one of (i) a feeding stage for preparing the monocrystalline silicon and (ii) a shutdown and cooling stage of the single crystal growth.

* * * * *